(12) United States Patent
Yoon et al.

(10) Patent No.: US 7,897,965 B2
(45) Date of Patent: Mar. 1, 2011

(54) DISPLAY SUBSTRATE, DISPLAY PANEL HAVING THE SAME, AND METHOD OF TESTING A DISPLAY SUBSTRATE

(75) Inventors: Young-Soo Yoon, Suwon (KR);
Joon-Chul Goh, Seoul (KR);
Chong-Chul Chai, Seoul (KR)

(73) Assignee: Samsung Electronics Co., Ltd. (KR)

( * ) Notice: Subject to any disclaimer, the term of this patent is extended or adjusted under 35 U.S.C. 154(b) by 21 days.

(21) Appl. No.: 12/336,849

(22) Filed: Dec. 17, 2008

(65) Prior Publication Data
US 2009/0206334 A1 Aug. 20, 2009

(30) Foreign Application Priority Data
Feb. 15, 2008 (KR) .............................. 2008-13949

(51) Int. Cl.
*H01L 23/58* (2006.01)

(52) U.S. Cl. .............................. 257/48; 257/59; 257/72; 257/84; 257/351; 257/E21.531

(58) Field of Classification Search .................. 257/48, 257/59, 72, 83, 351, 84
See application file for complete search history.

(56) References Cited

U.S. PATENT DOCUMENTS

| 5,657,139 A | * | 8/1997 | Hayashi | ........................ 349/40 |
| 2006/0202923 A1 | * | 9/2006 | Osada | ........................ 345/76 |
| 2007/0046316 A1 | * | 3/2007 | Uei et al. | ..................... 324/770 |

* cited by examiner

*Primary Examiner*—Wai-Sing Louie
(74) *Attorney, Agent, or Firm*—Cantor Colburn LLP

(57) ABSTRACT

A display substrate includes a gate wire, a data wire which crosses the gate wire, a display part, a dummy pixel part and a test part. The display part includes a pixel element electrically connected to the gate wire and the data wire, and the pixel element includes a display element. The dummy pixel part surrounds the display part to protect the pixel element from static electricity. The test part is formed adjacent to the display part and includes a test element having a test display element formed in a substantially same manner as the display element.

8 Claims, 6 Drawing Sheets

DISPLAY SUBSTRATE, DISPLAY PANEL HAVING THE SAME, AND METHOD OF TESTING A DISPLAY SUBSTRATE

This application claims priority to Korean Patent Application No. 2008-13949, filed on Feb. 15, 2008, and all the benefits accruing therefrom under 35 U.S.C. §119, the contents of which in its entirety are herein incorporated by reference.

BACKGROUND OF THE INVENTION

1. Field of the Invention

The present invention relates to a display substrate, a display panel including the display substrate, and a method of testing a display substrate. More particularly, the present invention relates to a display substrate having a substantially enhanced reliability, a display panel including the display substrate, and a method of testing a display substrate.

2. Description of the Related Art

Display devices such as monitors and television sets, for example, have an ongoing need for continually-improved characteristics such as having increasingly small sizes and light weights. As a result, cathode ray tube ("CRT") devices are being increasingly replaced with alternative display devices, such as liquid crystal display ("LCD") devices. However, an LCD device requires an additional light source, since a display panel of the LCD device is not self-emissive. Further, the LCD device has a relatively low response speed and a relatively narrow viewing angle, for example, in comparison with some other types of display devices.

An organic light-emitting diode ("OLED") display device has been identified as another relatively small and lightweight alternative to CRT devices. The OLED display device emits light by itself, e.g., is self-emitting, and the OLED display device also has a relatively wide viewing angle and a relatively high contrast ratio, for example, in comparison with an LCD device. Furthermore, since the OLED display device does not require an additional light source such as backlight assembly, the OLED display device is also relatively lightweight and consumes relatively low power in comparison with the LCD device. Additionally, the OLED display device has a relatively high response speed, a relatively wide operating temperature range and a relatively low manufacturing cost, for example, in comparison with the LCD device.

The OLED display device typically includes two electrodes and a light-emitting layer disposed therebetween. When an electron, injected from a first electrode, is coupled in a light-emitting layer with an imaginary particle (called an electron hole) injected from a second electrode, an exciton is formed. The exciton then releases energy to emit light and display an image.

The OLED display device is classified as either an active matrix type OLED display device or a passive matrix type OLED display device, based on a configuration of switching devices in the respective display device. Specifically, the active matrix type OLED display device includes a switching thin-film transistor ("TFT") and a driving TFT for each light-emitting element. In the active matrix type OLED, the switching TFT is electrically connected to a signal wire which supplies a data voltage. The driving TFT applies the data voltage to a control electrode to cause a current to flow in a given light-emitting element.

Operational characteristics of the OLED display device are determined by driving characteristics of the switching TFT, the driving TFT and the light-emitting element. As a result, operational reliability of the OLED display device is determined by the driving characteristics of the switching TFT, the driving TFT and the light-emitting element. However, it is difficult to determine the driving characteristics of the switching TFT, the driving TFT and the light-emitting element of a given OLED device during a manufacturing process of the given OLED display device.

BRIEF SUMMARY OF THE INVENTION

Exemplary embodiments of the present invention provide a display substrate having substantially enhanced operational reliability and an increased efficiency of a manufacturing process of the display substrate from a mother substrate.

Exemplary embodiments of the present invention also provide a display panel having the display substrate.

Exemplary embodiments of the present invention further also provide a method of testing the display substrate.

In an exemplary embodiment of the present invention, a display substrate includes a gate wire, a data wire which crosses the gate wire, a display part, a dummy pixel part and a test part. The display part includes a pixel element electrically connected to the gate wire and the data wire. The dummy pixel part surrounds the display part to protect the pixel element from static electricity. The pixel element includes a display element. The test part is disposed adjacent to the display part, and includes a test element. The test element includes a test display element formed in a substantially same manner as the display element.

The dummy pixel part may be disposed in a peripheral area of the display part to surround the display part, and the test part may be formed in a portion of the peripheral area of the display part.

The display part may have a rectangular shape having four peripheral corner areas, and the test part may be formed adjacent to at least one of the four peripheral corner areas of the display part.

The display substrate may further include a gate pad part formed at a first end portion of the gate wire, a data pad part formed at a first end portion of the data wire, a first voltage pad part formed at a second end portion of the gate wire opposite the first end portion of the gate wire, and a second voltage pad part formed at a second end portion of the data wire opposite the first end portion of the data wire.

The display substrate may further include a test pad part which applies a test signal to the test part, and the test pad part may be formed adjacent to at least one of the gate pad part, the data pad part, the first voltage pad part and the second voltage pad part.

The display substrate may further include a test wiring part including a first end portion electrically connected to the test part to deliver a test signal to the test part, and a second end portion which extends to a peripheral edge portion of the display substrate.

The display element of the pixel element may include a first switching element electrically connected to the gate wire and the data wire, a first driving element electrically connected to the switching element and a voltage wire, and a first electroluminescent element electrically connected to the first driving element.

The test element may include at least one of a second switching element formed in a substantially same manner as the first switching element, a second driving element formed in a substantially same manner as the first driving element and a second electroluminescent element formed in a substantially same manner as the first electroluminescent element.

In an alternative exemplary embodiment of the present invention, a display panel includes a display substrate and an opposite substrate which faces the display substrate. The display substrate includes a covered area in which the opposite substrate overlaps the display substrate and an exposed area in which the opposite substrate does not overlap the display substrate. The display substrate further includes a display part including a pixel formed in the covered area, and a test part. The test part is disposed outside the display part and includes a test element having a test display element formed in a substantially same manner as the display element.

The test portion may be disposed adjacent to the display part. The display part may have a rectangular shape including four peripheral corner areas, and the test part may be formed adjacent to at least one of the four peripheral corner areas of the display part.

The display panel may further include a dummy pixel part which protects the display part from static electricity, and the dummy pixel part may be formed in an area which surrounds the display part formed in the covered area. The test part may be formed in a portion of the area in which the dummy pixel part is formed.

The display substrate may further include a test pad portion formed in the exposed area to apply a test signal to the test part.

The display substrate may further include a test wiring part having a first end portion electrically connected to the test part to deliver a test signal to the test part, and a second end portion of the test wiring part may extend toward a peripheral edge portion of the exposed area of the display substrate.

The display substrate may further include a gate wire and a data wire which crosses the gate wire. The display element may include a first switching element, a first driving element and a first electroluminescent element. The first switching element may be electrically connected to the gate wire and the data wire. The first driving element may be electrically connected to the first switching element and a voltage wire. The first electroluminescent element may be electrically connected to the first driving element.

The test element may include at least one of a second switching element formed in a substantially same manner as the first switching element, a second driving element formed in a substantially same manner as the first driving element and a second electroluminescent element formed in a substantially same manner as the electroluminescent element.

Yet another alternative exemplary embodiment of the present invention provides a method testing a display substrate, the display part including a pixel element and a test part having a test element disposed adjacent to the display part. The method for testing the display substrate includes forming a display element in the pixel element, forming a test display element in the test part in a substantially same manner as the forming the display element in the pixel element, and applying a test signal to the test part.

The display substrate may further include a dummy pixel part disposed in an area which surrounds a periphery of the display part to protect the pixel element from static electricity, and the test part may be formed in a portion of the area which surrounds the periphery of the display part in which the dummy pixel part is formed.

According to exemplary embodiments of the present invention, a test element, and, more specifically, a test display element, formed by a manufacturing process identical to, e.g., substantially the same as, a manufacturing process of a display element formed in a pixel, is formed adjacent to the pixel, and driving characteristics of the display element are thereby accurately and efficiently predicted. Thus, a reliability of a display substrate and a display panel having the same is substantially enhanced. Moreover, an efficiency of a manufacturing process is enhanced when one mother substrate is manufactured to provide a plurality of display substrates.

BRIEF DESCRIPTION OF THE DRAWINGS

The above and other aspects, features and advantages of the present invention will become more readily apparent by describing in further detail exemplary embodiments thereof with reference to the accompanying drawings, in which.

DETAILED DESCRIPTION OF THE INVENTION

Figure 1:
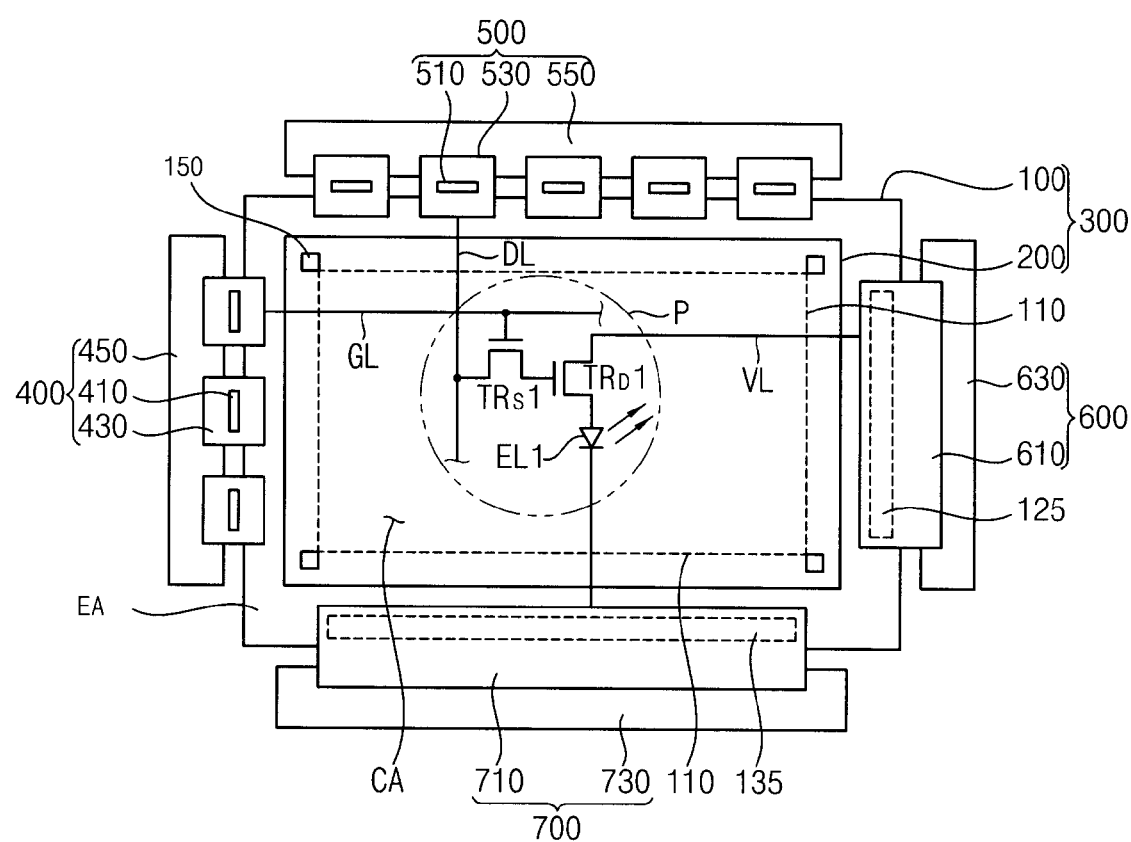
FIG. 1 is a plan view of a display device according to an exemplary embodiment of the present invention.

The invention will now be described more fully hereinafter with reference to the accompanying drawings, in which exemplary embodiments of the invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including," when used in this specification, specify the presence of stated features, regions, integers, steps, operations, elements and/or components, but do not preclude the presence or addition of one or more other features, regions, integers, steps, operations, elements, components and/or groups thereof.

Furthermore, relative terms, such as "lower" or "bottom" and "upper" or "top" may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on the "upper" side of the other elements. The exemplary term "lower" can, therefore, encompass both an orientation of "lower" and "upper," depending upon the particular orientation of the figure. Similarly, if the device in one of the figures were turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning which is consistent with their meaning in the context of the relevant art and the present disclosure, and will not be interpreted in an idealized or overly formal sense unless expressly so defined herein.

Exemplary embodiments of the present invention are described herein with reference to cross section illustrations which are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes which result, for example, from manufacturing. For example, a region illustrated or described as flat may, typically, have rough and/or nonlinear features. Moreover, sharp angles which are illustrated may be rounded. Thus, the regions illustrated in the figures are schematic in nature and their shapes are not intended to illustrate the precise shape of a region and are not intended to limit the scope of the present invention.

Hereinafter, exemplary embodiments of the present invention will be described in further detail with reference to the accompanying drawings.

FIG. 1 is a plan view of a display device according to an exemplary embodiment of the present invention.

Referring to FIG. 1, a display device includes a display panel 300, a gate driving part 400, a data driving part 500, a first power providing part 600 and a second power providing part 700.

The display panel 300 includes a display substrate 100 and an opposite substrate 200. In an exemplary embodiment, the opposite substrate 200 is disposed opposite to, e.g., faces, the display substrate 100. The display substrate 100 includes a covered area CA covered by the opposite substrate 200, and an exposed area EA not covered by the opposite substrate 200, e.g., is exposed by the opposite substrate 200.

The covered area CA includes a display part 110 which, in operation, displays an image. At least one test part 150 is formed substantially adjacent to at least one of four corner areas of a rectangular shape defined by the display part 110, as shown in FIG. 1.

The display part 110 includes a plurality of pixels P. Each pixel P of the plurality of pixels P includes a display element (not specifically labeled in FIG. 1). In an exemplary embodiment, the display element includes a first switching element $TR_S1$, a first driving element $TR_D1$ and a first electroluminescent element EL1, as shown in FIG. 1. More specifically, the first switching element $TR_S1$ is electrically connected to a gate line GL and a data line DL which crosses the gate line GL. The first driving element $TR_D1$ is electrically connected to the first switching element $TR_S1$, the first electroluminescent element EL1 and a voltage line VL. The first electroluminescent element EL1 is electrically connected to the first driving element $TR_D1$ and the second power providing part 700.

The first electroluminescent element EL1 includes an anode (not shown), e.g., a pixel electrode, a cathode (not shown), e.g., a common electrode and an electroluminescent light-emitting element layer (not shown) therebetween. In an exemplary embodiment of the present invention, the pixel electrode is formed of a reflective electrode or a transmitting electrode, based on whether the first electroluminescent element EL1 is a bottom light-emitting type device or a top light-emitting type device. Further, the electroluminescent element light-emitting layer according to an exemplary embodiment may include a hole-injection layer, a hole-transferring layer, a light-emitting layer and an electron-transferring layer, sequentially formed on each other. Alternatively, the electroluminescent element light-emitting layer may include a hole-transferring layer, a light-emitting layer and an electron-transferring layer, sequentially formed on each other. In another alternative exemplary embodiment of the present invention, the electroluminescent element light-emitting layer may include a hole-injection layer, a hole-transferring layer, a light-emitting layer, an electron-transferring layer and an electrode-injection layer sequentially formed on each other.

Referring still to FIG. 1, the test part 150 includes a test element (not shown), and more particularly, a test display element, formed using a manufacturing process having conditions identical to, e.g., substantially the same as, a manufacturing process of the display element of the display part 110.

In an exemplary embodiment, the display part 110 may have a substantially rectangular shape, and the test part 150 may be formed adjacent to one or more of the four corner areas of the rectangular shape defined by the display part 110, and as illustrated in FIG. 1.

The test display element is formed to test driving characteristics of the display element of the pixels P in the display part 110, to determine, among other things, whether the display element needs to be adjusted and/or replaced during a manufacturing process of the display substrate 100. Since the test part 150 is formed to the display part 110, the test part 150 is driven under the substantially same driving conditions as the driving conditions of the display part 110. As a result, the test part 150 more accurately predicts characteristics of the display element of each pixel P of the display part 110, thereby substantially increasing an operational reliability of the display part 100 according to an exemplary embodiment of the present invention.

The gate driving part 400 includes a gate driving chip 410, a gate flexible printed circuit board ("FPCB") 430 and a gate printed circuit board ("PCB") 450. The gate driving chip 410 generates a gate signal which is applied to the gate line GL formed on the display substrate 100. The gate driving chip 410 is mounted on the gate FPCB 430. As shown in FIG. 1, a first edge of the gate FPCB 430 makes contact with a gate pad part 120 (FIG. 2) formed in an exposed area EA of the display substrate 100. The gate PCB 450 makes contact with a second edge portion of the gate FPCB 430, and delivers a gate driving signal provided from a main driving circuit (not shown) to the gate FPCB 430.

The data driving part 500 includes a data driving chip 510, a data FPCB 530 and a data PCB 550. The data driving chip 510 generates a data signal which is applied to the data line DL formed on the display substrate 100. The data driving chip 510 is mounted on the data FPCB 530. A first edge portion of the data FPCB 530 makes contact with a data pad part (FIG. 2) formed in the exposed area EA of the display substrate 100. The data PCB 550 makes contact with a second edge portion of the data FPCB 530, and delivers a data driving signal provided from the main driving circuit to the data FPCB 530.

The first power providing part 600 is disposed to be opposite to the gate driving part 400. The first power providing part 600 includes a first FPCB 610 and a first PCB 630. A first edge portion of the first FPCB 610 makes contact with a first voltage pad part 125 formed in the exposed area EA of the display substrate 100, and a second edge portion of the first FPCB 610 makes contact with the first PCB 630. The first PCB 610 delivers a bias voltage Vd provided from the main driving circuit (not shown) to the first FPCB 610. The bias voltage Vd is applied to the first driving element $TR_D1$ of the pixel P through the voltage line VL.

The second power providing part 700 is disposed substantially opposite the data driving part 500, as shown in FIG. 1. The second power providing part 700 includes a second FPCB 710 and a second PCB 730. A first edge portion of the second FPCB 710 makes contact with a second voltage pad part 135 formed in the exposed area EA of the display substrate 100, and a second edge portion of the second FPCB 710 makes contact with the second PCB 730. The second PCB 730 delivers a common voltage Vcom provided from the main driving circuit (not shown) to the second FPCB 710. The common voltage Vcom is applied to a cathode of the first electroluminescent element EL1 of the pixel P.

As described above, the first power providing part 600 provides the display part 110 with the bias voltage Vd, while the second power providing part 700 provides the display part 110 with the common voltage Vcom. In an alternative exemplary embodiment of the present invention, however, the first power providing part 600 may provide the display part 110 with the common voltage Vcom, and the second power providing part 700 may provide the display part 110 with the bias voltage Vd.

Figure 2:
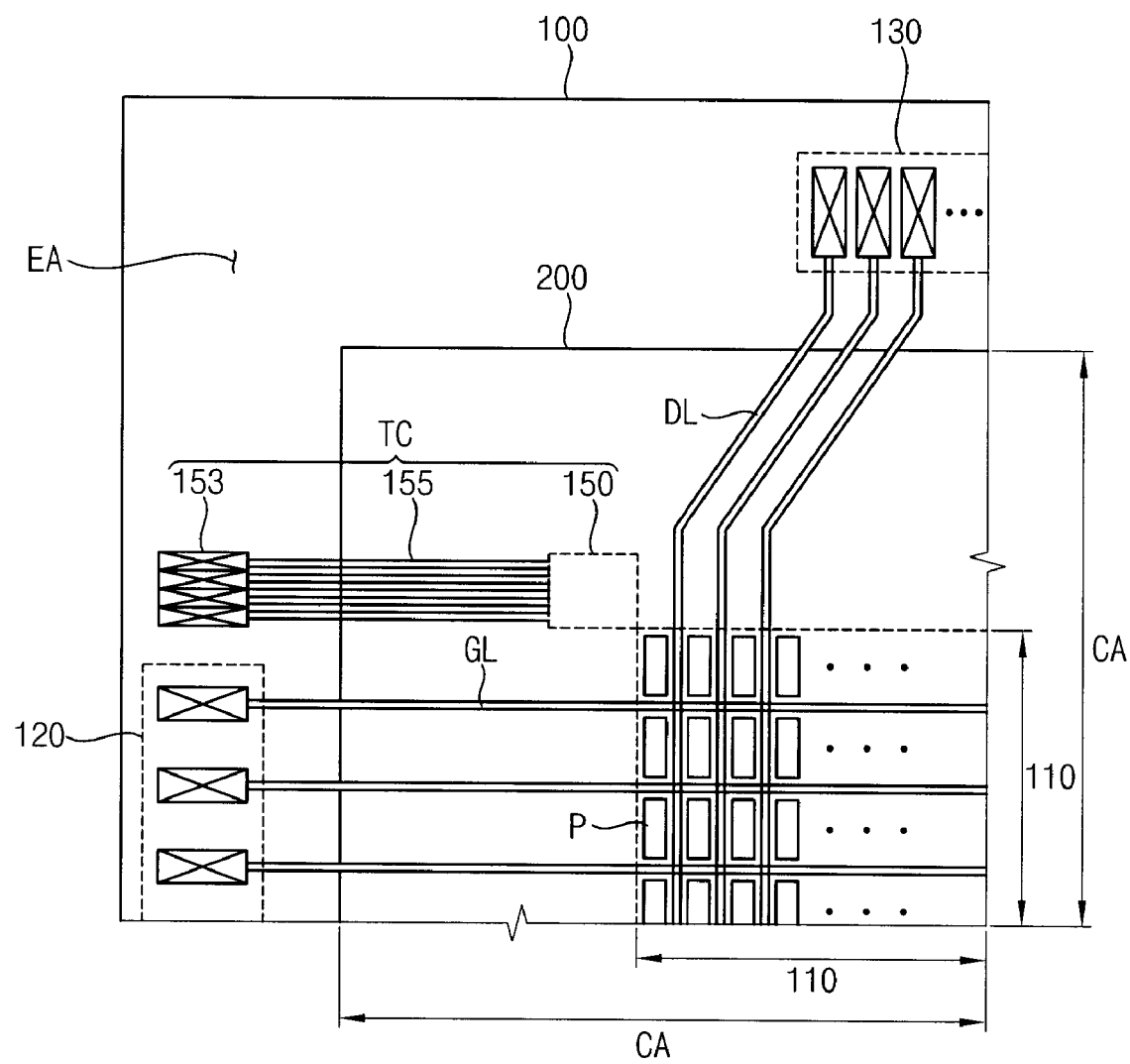
FIG. 2 is an enlarged view of a corner portion of the display panel according to the exemplary embodiment of the present invention shown in FIG. 1.

FIG. 2 is an enlarged view of a corner portion of the display panel according to the exemplary embodiment of the present invention shown in FIG. 1.

Referring to FIGS. 1 and 2, a display panel includes a display substrate 100 and an opposite substrate 200 combined with and facing, e.g., disposed opposite to, the display substrate 100.

The display substrate 100 has a covered area CA overlapped by the opposite substrate 200 and an exposed area EA not overlapped by the opposite substrate 200. In an exemplary embodiment of the present invention, the exposed area EA is located around an outer periphery of the display substrate 100, as shown in FIG. 1.

A plurality of gate lines GL and a plurality of data lines DL are formed in the covered area CA. In an exemplary embodiment, data lines DL of the plurality of data lines D1 cross gate lines GL of the plurality of gate lines GL. Further, a plurality of pixels P may be formed in an area where the gate lines GL and the data lines DL cross. A test part 150 is formed at an area adjacent to a corner area of a display part 110, as shown in FIGS. 1 and 2. The test part 150 according to an exemplary embodiment includes a test element, and, more specifically, a test display element, formed using a manufacturing process having conditions identical to a manufacturing process of the display element formed in the display part 110.

Each of a gate pad part 120, a data pad part 130 and a test pad part 153 is formed in the exposed area EA. In an alternative exemplary embodiment of the present invention, the first voltage pad part 125 and/or the second voltage pad part 135 (FIG. 1) may also be formed at the exposed area EA of the display substrate 100.

The gate pad part 120 is formed at a first edge portion of the gate lines GL and is connected to the first edge of the gate FPCB 430 (FIG. 1). The data pad part 130 is formed at a first edge portion of the data lines DL to be coupled to the first edge of the data FPCB 530 (FIG. 1). The test pad part 153 is electrically connected to the test part 150 and is connected to end terminals of a test device (not shown), such that a test signal generated from the test device is applied to the display part 110. The test pad part 153 and the test part 150 are electrically connected by a test wiring part 155. In an exemplary embodiment, a test circuit TC includes the test part 150, the test pad part 153 and the test wiring part 155, as will be described in further detail below.

The test pad part 153 includes a test pad (not shown) that applies a test signal to a test element (not shown) formed in the test part 150. In an exemplary embodiment, the test pad part 153 includes at least two input pads (not shown) when an electroluminescent element (not shown) is formed in the test part 150, and the test part 150 includes at least three pads when an electroluminescent element electrically connected to a driving element (not shown) is formed in the test part 150. Alternatively, the test pad part 153 includes at least four input pads when an electroluminescent element electrically connected to a switching element (not shown) and a driving element is formed in the test part 150, and the test pad part 153 includes at least three input pads when a switching element is formed in the test part 150. The above-mentioned alternative configurations of the test pad 150 will now be described in further detail with reference to FIGS. 2 and 3A to 3D

FIGS. 3A to 3D are equivalent schematic circuit diagrams of a test circuit according to alternative exemplary embodiments of the present invention.

Figure 3A:
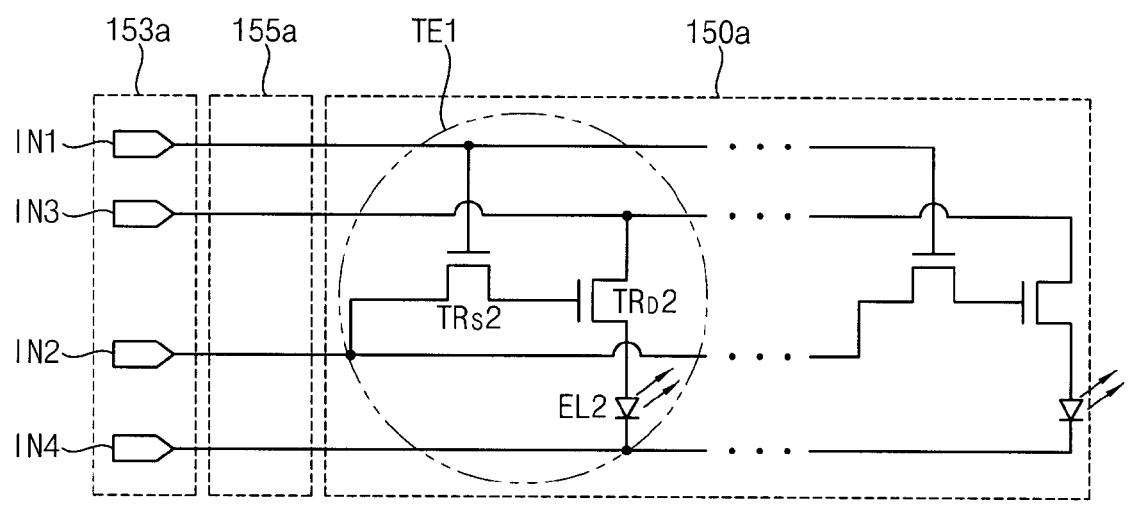
FIGS. 3A to 3D are equivalent schematic circuit diagrams of a test circuit according to alternative exemplary embodiments of the present invention.

Referring to FIGS. 2 and 3A, a test circuit TC according to an exemplary embodiment of the present invention includes a test part 150a, a test pad part 153a and a test wiring part 155a.

The test part 150a includes a unit test part TE1 including a second switching element $TR_S2$, a second driving element $TR_D2$ and a second electroluminescent element EL2 each formed using a manufacturing process having conditions identical, e.g., substantially the same as, that of a manufacturing process of a display element formed in the pixel P. Specifically, manufacturing processes for the second switching element $TR_S2$, the second driving element $TR_D2$ and the second electroluminescent element EL2 are substantially the same as manufacturing processes for the first switching element $TR_S1$, the first driving element $TR_D1$ and the first electroluminescent element EL1, respectively. In an exemplary embodiment of the present invention, the test part 150a includes one unit test part TE1 or, alternatively, the test part 150a may include a plurality of unit test parts TE1 (as shown in FIG. 3A).

The test pad part 153a includes a first input pad IN1, a second input pad IN2, a third input pad IN3 and a fourth input pad IN4. The test wiring part 155a electrically connects the test part 150a to the test pad part 153a.

The second switching element $TR_S2$ includes a gate electrode electrically connected to the first input pad IN1, a source electrode electrically connected to the second input pad IN2 and a drain electrode electrically connected to the second driving element $TR_D2$. The second driving element $TR_D2$ includes a gate electrode electrically connected to a drain electrode of the second switching element $TR_S2$, a source electrode electrically connected to the third input pad IN3 and a drain electrode electrically connected to the second electroluminescent element EL2. The second electroluminescent element EL2 includes an anode electrically connected to a drain electrode of the second driving element $TR_D2$ and a cathode electrically connected to the fourth input pad IN4.

The first input pad IN1 receives a test signal substantially the same as a gate signal of the pixel P, and the second input pad IN2 receives a test signal substantially the same as a bias voltage Vd of the pixel P. The third input pad IN3 receives a test signal substantially the same as a data signal of the pixel P, and the fourth input pad IN4 receives a test signal substantially the same as a common voltage Vcom of the pixel P.

The unit test part TE1 may be driven by the above-mentioned test signals applied to the first to fourth input pads IN1, IN2, IN3 and IN4, respectively, under a substantially same driving condition as for the pixel P. Thus, during a manufacturing process, an operator, e.g., an inspector, tests driving characteristics of the test part 150a, and driving characteristics of the display part 110, e.g., the pixel P, are thereby accurately and efficiently predicted.

Figure 3B:
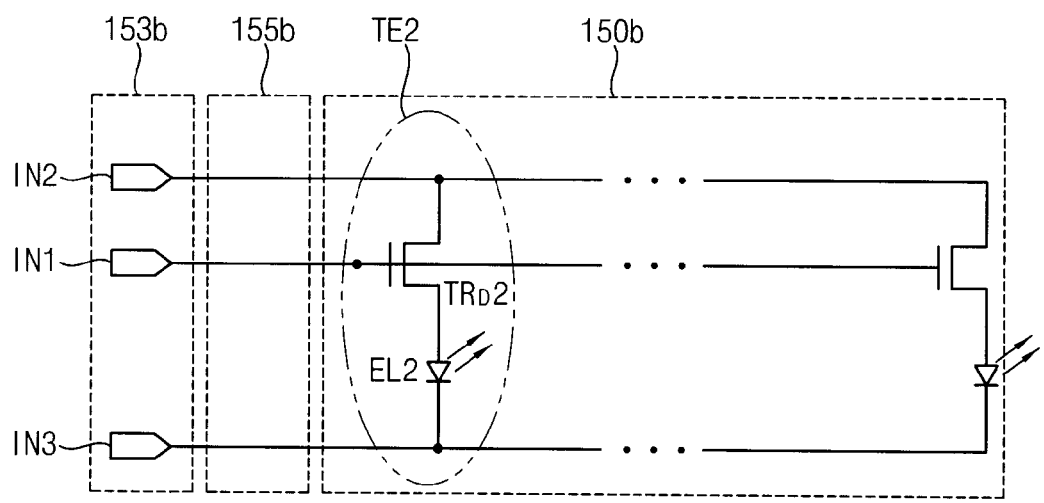

Referring to FIGS. 2 and 3B, a test circuit TC according to an alternative exemplary embodiment of the present invention includes a test part 150b, a test pad part 153b and a test wiring part 155b.

The test part 150b includes a unit test part TE2 including a second driving element $TR_D2$ and a second electroluminescent element EL2 that are formed under a manufacturing process having conditions identical to, e.g., substantially the same as, a manufacturing process of a display element formed in the pixel P. Specifically, the second driving element $TR_D2$ and the second electroluminescent element EL2 are formed in substantially the same manner as the first driving element $TR_D1$ and the first electroluminescent element EL1, respectively. In an exemplary embodiment, the test part 150b may include one unit test part TE2. Alternative exemplary embodiments of the present invention, however, may include a plurality unit test parts TE2, as shown in FIG. 3B.

The test pad part 153b includes a first input pad IN1, a second input pad IN2 and a third input pad IN3. The test wiring part 155b electrically connects the test part 150b to the test pad part 153b.

The second driving element $TR_D2$ includes a gate electrode electrically connected to a first input pad IN1, a source electrode electrically connected to a second input pad IN2 and a drain electrode electrically connected to the second electroluminescent element EL2. The second electroluminescent element EL2 includes an anode electrically connected to the drain electrode of the second driving element $TR_D2$ and a cathode electrically connected to a third input pad IN3.

The first input pad IN1 receives a test signal controlling a on/off state of the second driving element $TR_D2$, the second input pad IN2 receives a test signal substantially the same as a bias voltage Vd of the pixel P, and the third input pad IN3 receives a test signal substantially the same as a common voltage Vcom of the pixel P.

Thus unit test part TE2 is driven by the above-mentioned test signals applied to the first to third input pads IN1, IN2 and IN3, respectively. As a result, an inspector tests driving characteristics of the test part 150b, and driving characteristics of the first driving element $TR_D1$ and the first electroluminescent element EL1 formed in the display part 110 are thereby accurately and efficiently predicted.

Figure 3C:
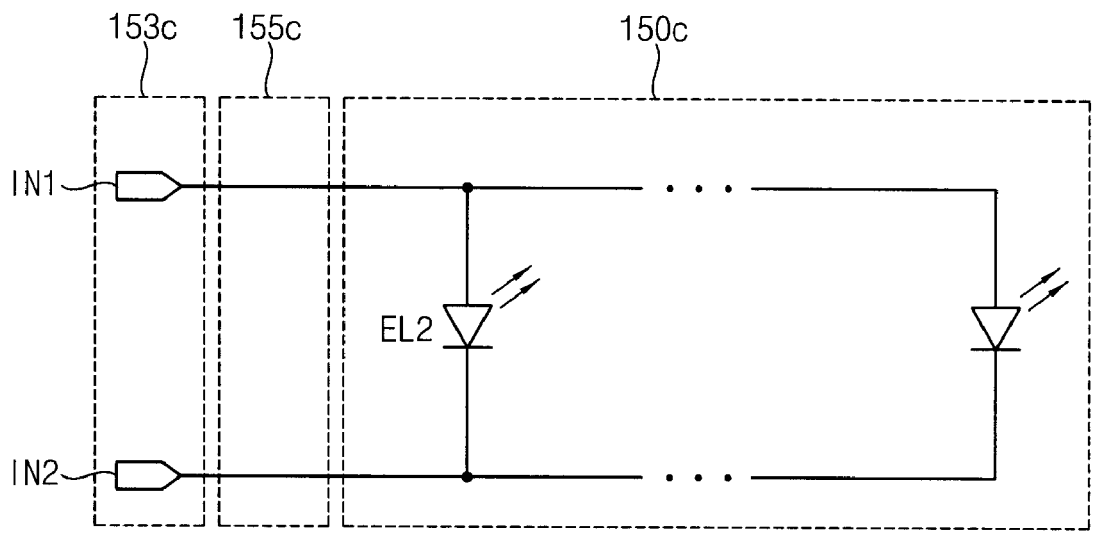

Referring to FIGS. 2 and 3C, a test circuit TC according to an alternative exemplary embodiment of the present invention includes a test part 150c, a test pad part 153c and a test wiring part 155c.

The test part 150c includes a second electroluminescent element EL2 formed under a manufacturing process having conditions identical to, e.g., substantially the same as, a manufacturing process of a first electroluminescent element EL1 formed in the pixel P. The test part 150c according to an exemplary embodiment of the present invention includes one second electroluminescent element EL2, but alternative exemplary embodiments are not limited thereto. For example, the test part 150c may include a plurality of second electroluminescent elements EL2, as shown in FIG. 3C.

The test pad part 153c includes a first input pad IN1 and a second input pad IN2. The test wiring part 155c electrically connects the test part 150c to the test pad part 153c.

The second electroluminescent element EL2 includes an anode electrically connected to the first input pad IN1 and a cathode electrically connected to the second input pad IN2. The first input pad IN1 receives a predetermined test signal, and the second input pad IN2 receives a test signal substantially the same as a common voltage Vcom of the pixel P.

Thus, an inspector tests driving characteristics of the test part 150c, and corresponding driving characteristics of the first electroluminescent element EL formed in the display part 110 are thereby accurately and efficiently predicted.

Figure 3D:
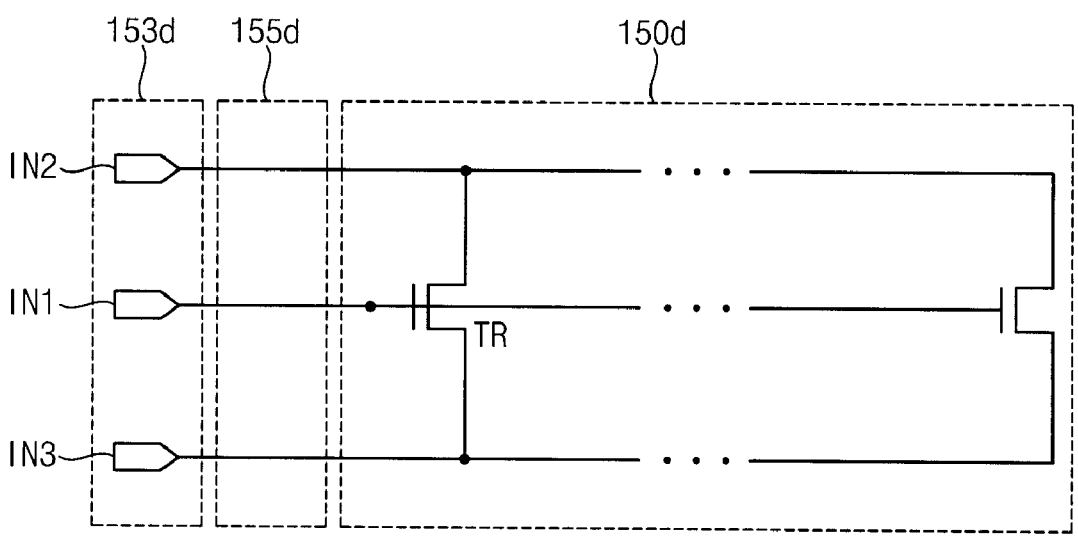

Referring to FIGS. 2 and 3D, a test circuit TC according to an alternative exemplary embodiment of the present invention includes a test part 150d, a test pad part 153d and a test wiring part 155d.

The test part 150d includes a thin-film transistor ("TFT") TR formed under a manufacturing process having conditions identical to, e.g., substantially the same as, a manufacturing process of the first switching element $TR_S1$ or, alternatively, the first driving element $TR_D1$ formed in the pixel P. The test part 150d may include one TFT TR or, alternatively, a plurality of TFTs TR, as shown in FIG. 3D.

The test pad part 153d includes a first input pad IN1 electrically connected to a gate electrode of the TFT TR, a second input pad IN2 electrically connected to a source electrode of the TFT TR and a third input pad IN3 electrically connected to a drain electrode of the TFT TR. The test wiring part 155d electrically connects the test part 150d to the test pad part 153d.

Each of the first to third input pads IN1, IN2 and IN3, respectively, receives a predetermined test signal. Thus, an inspector tests driving characteristics of the test pad 150d, driving characteristics of the first switching element $TR_S1$ or, alternatively, the first driving element $TR_D1$ formed in the display part 110 are accurately and efficiently predicted.

In an exemplary embodiment of the present invention, the test circuit TC formed adjacent to a corner area of the display part 110, as shown in FIG. 2, may include any or all of the test circuits TC as described above and alternatively shown in FIGS. 3A to 3D.

Figure 4:
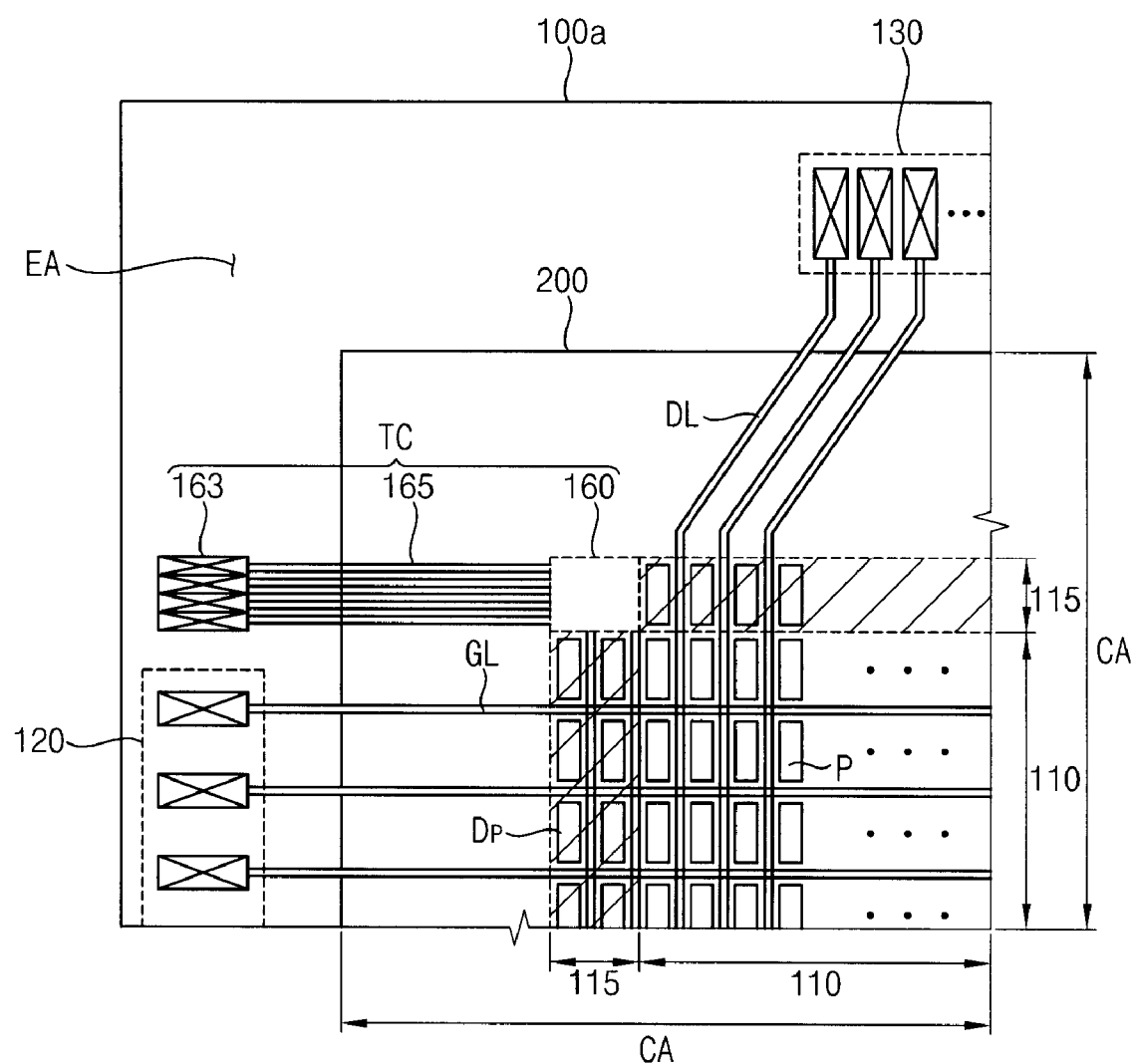
FIG. 4 is an enlarged view of a corner portion of a display panel according to an alternative exemplary embodiment of the present invention.

FIG. 4 is an enlarged view of a corner portion of a display panel according to an alternative exemplary embodiment of the present invention.

Referring to FIGS. 1 and 4, a display panel includes a display substrate 100a and an opposite substrate 200 combined with and facing, e.g., disposed opposite to, the display substrate 100a.

The display substrate 100a includes a covered area CA overlapped by the opposite substrate 200, and an exposed area EA not overlapped by the opposite substrate 200.

A plurality of gate lines GL and a plurality of data lines DL each crossing gate lines GL of the plurality of gate lines GL are formed in the covered area CA. In an exemplary embodiment of the present invention, pixels P are formed at areas where the gate lines GL and the data lines DL cross in a display part 110 in the covered area CA. A dummy pixel part 115 is disposed adjacent to an outer peripheral area of the display part 110, as shown in FIG. 4.

More specifically, the dummy pixel part 115 is formed to substantially surround the display part 110. The dummy pixel part 115 includes a dummy pixel $D_P$ configured identical to, e.g., substantially the same as, a pixel P of the display part 110. In operation, the dummy pixel $D_P$ does not display an image. The dummy pixel part 115 protects the pixel P of the display part 110 from static electricity generated, for example, during a process in which the display substrate 110a is manufactured.

A test part 160 is formed in a portion of an area where the dummy pixel part 115 is formed. In an exemplary embodiment of the present invention, for example, the test part 160 is formed adjacent to at least one of four outer peripheral corner areas of the display part 110, as illustrated in FIG. 4. The test part 160 according to an exemplary embodiment may include a test element (not shown) formed under a manufacturing process having conditions identical to, e.g., substantially the same as, a manufacturing process of the display element of the pixel P. In an exemplary embodiment of the present invention, the test element includes a test display element, but alternative exemplary embodiments are not limited thereto.

Each of a gate pad part 120, a data pad part 130 and a test pad part 163 is formed in the exposed area EA. In an alternative exemplary embodiment, the first voltage pad part 125 and/or the second voltage pad part 135 (FIG. 1) may also be formed at the exposed area EA.

The gate pad part 120 is formed at a first edge portion of the gate lines GL to connect to the first edge of the gate FPCB 430 (FIG. 1). The data pad part 130 is formed at a first edge portion of the data lines DL to connect to the first edge of the data FPCB 530 (FIG. 1). The test pad part 163 is electrically connected to the test part 160 to connect to end terminals of a test device (not shown), such that a test signal generated from the test device is applied to the display part 110. The test pad part 163 and the test part 160 are electrically connected by a test wiring part 165, and a test circuit TC may include the test part 160, the test pad part 163 and the test wiring part 165.

The test circuit TC formed in adjacent to a peripheral corner area of the display part 110, as shown in FIG. 4, may include any or all of the above-mentioned test circuits as described in greater detail above with respect to alternative exemplary embodiments shown in FIGS. 3A to 3D.

Figure 5:
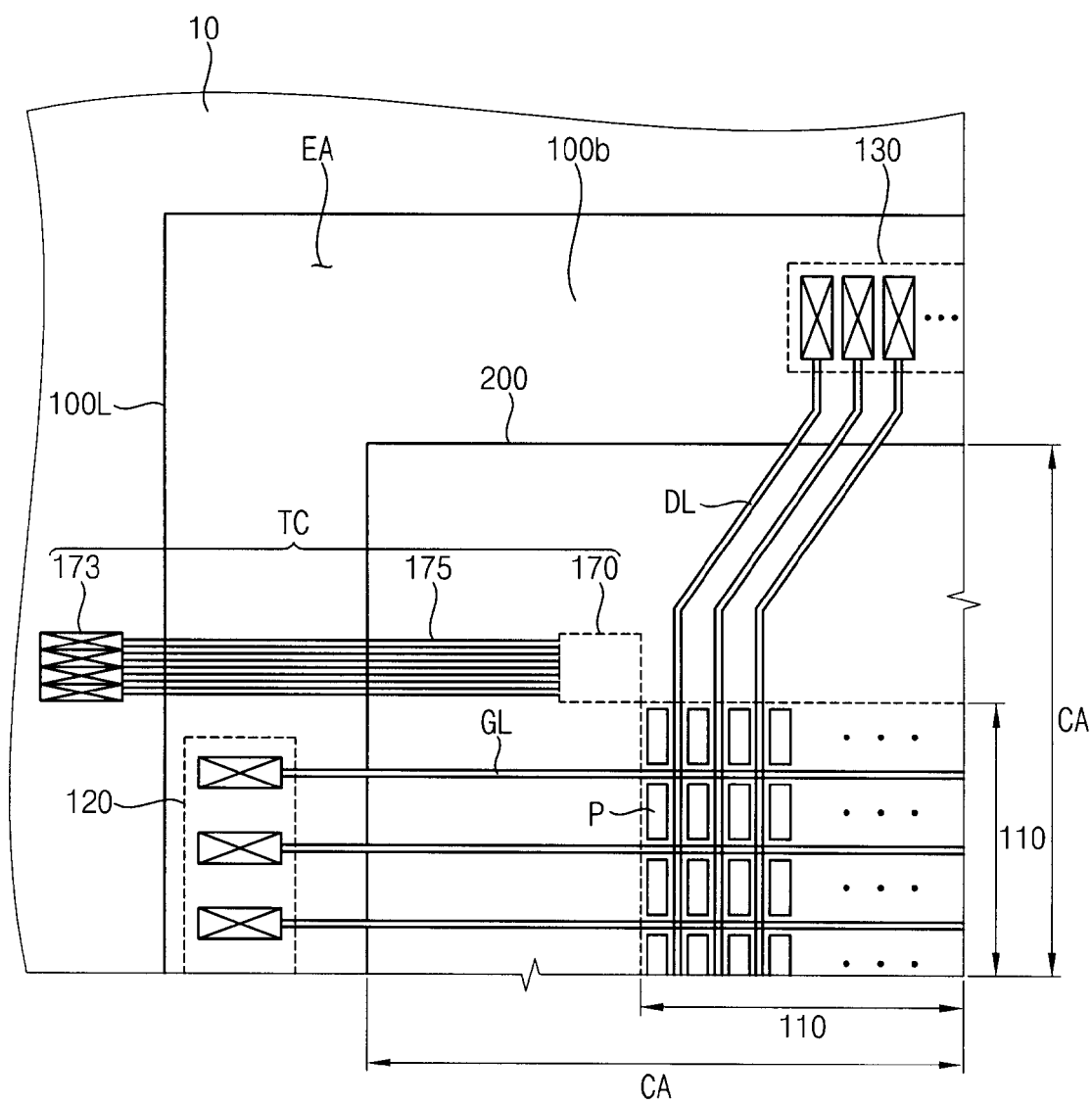
FIG. 5 is an enlarged view of a corner portion of a display panel according to another alternative exemplary embodiment of the present invention.

FIG. 5 is an enlarged view of a corner portion of a display panel according to another alternative exemplary embodiment of the present invention.

Referring to FIGS. 1 and 5, a display panel includes a display substrate 100b and an opposite substrate 200 combined with and facing, e.g., disposed substantially opposite to, the display substrate 100b. The display substrate 100b is formed by cutting along a cut line 100L on a mother substrate 10.

The display substrate 100b has a covered area CA overlapped by the opposite substrate 200, and an exposed area EA not overlapped by the opposite substrate 200.

A plurality of gate lines GL and a plurality of data lines DL each crossing gate lines GL of the plurality of gate lines GL are formed in the covered area CA. Pixels P are formed in an area where the gate lines GL and the data lines DL cross in a display part 110. A test part 170 is formed at an outer peripheral corner area of the display part 110. The test part 170 according to an exemplary embodiment of the present invention includes a test element formed under a manufacturing process having conditions identical to, e.g., substantially the same as, a manufacturing process of the display element formed in the pixel P.

Each of a gate pad part 120 and a data pad part 130 is formed in the exposed area EA. Although not shown in FIG. 5, the first voltage pad part 125 and/or the second voltage pad part 135 (FIG. 1) may also be formed at the exposed area EA.

The gate pad part 120 is formed at a first edge portion of the gate lines GL to connect to the first edge of the gate FPCB 430 (FIG. 1). The data pad part 130 is formed at a first edge portion of the data lines DL to connect to the first edge of the data FPCB 530 (FIG. 1).

A test pad part 173 is formed on the mother substrate 10 adjacent to the cut line 100L. The test pad part 173 is electrically connected to the test part 170 to connect to end terminals of a test device (not shown), and a test signal generated from the test device is thereby applied to the display part 110. The test pad part 173 and the test part 170 are electrically connected by a test wiring part 175, and a test circuit TC according to an exemplary embodiment includes the test part 170, the test pad part 173 and the test wiring part 175. The test circuit TC formed in one corner area as shown in FIG. 5 may include any or all of the test circuits as described in greater detail above and shown in FIGS. 3A to 3D.

After test process, described in greater detail above, is performed, the mother substrate 10 is cut along the cut line 100L to form the display substrate 110b.

Specifically, the test part 170 and the test wiring part 175 are on the display substrate 100b, while the test pad part 173 is not on the display substrate 100b, e.g., the test pad part 173 is on the mother substrate 10. As a result, a first end terminal of the test wiring part 175 formed in the display substrate 100b is electrically connected to the test part 170, and a second terminal of the test wiring part 175 is extended to an edge portion of the display substrate 100b.

In FIG. 5, when the test part 170 is formed adjacent to an outer peripheral corner of the display part 110, the test pad part 173 is formed at an exterior, e.g., outer, side of the cut line 100L. Alternatively, a test part 160 (FIG. 4) may be formed in a portion area where a dummy pixel part 115 (FIG. 4) is formed, and a test pad part 163 (FIG. 4) may be formed at the exterior side of the cut line 100L in accordance with the exemplary embodiment of the present invention described in greater detail above with reference to FIGS. 1 and 4.

According to exemplary embodiments of the present invention as described herein, a test element formed under a process condition identical to a process condition of a display element formed in a pixel is formed in an area adjacent to the display part such as a covered area, as well as in an area where a dummy pixel part is formed, and driving characteristics of the display element are thereby obtained using the test element. Therefore, a reliability of a display substrate and a display panel having the same are substantially enhanced.

Moreover, the test element is formed in adjacent to the display part of the display substrate, and an efficiency of the mother substrate may be further enhanced when one mother substrate is manufactured to yield a plurality of display substrates.

The present invention should not be construed as being limited to the exemplary embodiments set forth herein. Rather, these exemplary embodiments are provided so that this disclosure will be thorough and complete and will fully convey the concept of the present invention to those skilled in the art. For example, an alternative exemplary embodiment of the present invention provides a method testing a display substrate (the display part including a pixel element and a test part having a test element disposed adjacent to the display part).

Specifically, a method for testing a display substrate according to an exemplary embodiment includes forming a display element in the pixel element, forming a test display element in the test part in a substantially same manner as the forming the display element in the pixel element, and applying a test signal to the test part. In addition, the display substrate may further include a dummy pixel part disposed in an area which surrounds a periphery of the display part to protect the pixel element from static electricity, and the test part may be formed in a portion of the area which surrounds the periphery of the display part in which the dummy pixel part is formed.

Although the present invention has been particularly shown and described with reference to exemplary embodiments thereof, it will be understood by those of ordinary skill in the art that various changes and modifications in form and detail may be made therein without departing from the spirit or scope of the present invention as defined by the following claims.

What is claimed is:

1. A display panel comprising:
   a display substrate; and
   an opposite substrate which faces the display substrate, wherein the display substrate comprises:
   a covered area in which the opposite substrate overlaps the display substrate;
   an exposed area in which the opposite substrate does not overlap the display substrate;
   a display part comprising a pixel formed in the covered area, the pixel comprising a display element;
   a test part disposed in the covered area and outside of the display part and comprising a test element including a test display element formed in a substantially same manner as the display element; and
   a dummy pixel part protecting the display part from static electricity and formed in an area which surrounds the display part formed in the covered area.

2. The display panel of claim 1, wherein the test part is disposed adjacent to the display part.

3. The display panel of claim 1, wherein
   the display part has a rectangular shape comprising four peripheral corner areas, and
   the test part is formed adjacent to at least one of the four peripheral corner areas of the display part.

4. The display panel of claim 3, wherein the test part is formed in a portion of the area in which the dummy pixel part is formed.

5. The display panel of claim 1, wherein the display substrate further comprises a test pad part formed in the exposed area and which applies a test signal to the test part.

6. The display panel of claim 1, wherein the display substrate further comprises a test wiring part, the test wiring part comprising:
   a first end portion electrically connected to the test part to deliver a test signal to the test part; and
   a second end portion which extends toward a peripheral edge portion of the exposed area of the display substrate.

7. The display panel of claim 1, wherein the display substrate further comprises:
   a gate wire; and
   a data wire which crosses the gate wire, and
   the display element comprises:
   a first switching element electrically connected to the gate wire and the data wire;
   a first driving element electrically connected to the first switching element and a voltage wire; and
   a first electroluminescent element electrically connected to the first driving element.

8. The display panel of claim 7, wherein the test element comprises at least one of a second switching element formed in a substantially same manner as the first switching element, a second driving element formed in a substantially same manner as the first driving element and a second electroluminescent element formed in a substantially same manner as the first electroluminescent element.

* * * * *